(12) United States Patent
Nakahira et al.

(10) Patent No.: US 11,183,990 B2
(45) Date of Patent: Nov. 23, 2021

(54) DEAD TIME GENERATOR AND DIGITAL SIGNAL PROCESSING DEVICE

(71) Applicant: SHARP KABUSHIKI KAISHA, Osaka (JP)

(72) Inventors: Tsuyoshi Nakahira, Hyogo (JP); Akihiro Nishigaki, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 16/627,997

(22) PCT Filed: Jun. 22, 2018

(86) PCT No.: PCT/JP2018/023844
§ 371 (c)(1),
(2) Date: Dec. 31, 2019

(87) PCT Pub. No.: WO2019/021709
PCT Pub. Date: Jan. 31, 2019

(65) Prior Publication Data
US 2020/0220527 A1 Jul. 9, 2020

(30) Foreign Application Priority Data
Jul. 28, 2017 (JP) .............................. JP2017-147090

(51) Int. Cl.
*G05F 1/04* (2006.01)
*H03K 3/017* (2006.01)
*H03F 3/217* (2006.01)

(52) U.S. Cl.
CPC ............. *H03K 3/017* (2013.01); *H03F 3/217* (2013.01)

(58) Field of Classification Search
CPC .... G06F 1/10; G06F 1/04; G06F 1/08; H03K 5/135; G11C 7/22
USPC .............................. 327/291, 31–38
See application file for complete search history.

(56) References Cited

U.S. PATENT DOCUMENTS

| | | | | |
|---|---|---|---|---|
| 5,973,525 A * | 10/1999 | Fujii | ..................... | H03L 7/0814 327/158 |
| 6,906,554 B1 * | 6/2005 | Chen | ..................... | G06F 1/3203 326/93 |
| 2002/0145932 A1 * | 10/2002 | Nguyen | ................. | G11C 7/225 365/227 |
| 2010/0315126 A1 * | 12/2010 | Kim | ................... | H03K 19/0963 326/98 |
| 2013/0223652 A1 | 8/2013 | Sahandiesfanjani et al. | | |
| 2014/0062565 A1 * | 3/2014 | Sathe | ................... | H03K 19/003 327/294 |

FOREIGN PATENT DOCUMENTS

JP 2015-508980 A 3/2015

\* cited by examiner

*Primary Examiner* — Quan Tra
(74) *Attorney, Agent, or Firm* — ScienBiziP, P.C.

(57) ABSTRACT

A clock synchronization signal generator generates a dead time in which gates of both of two switching elements included in a switching circuit are in an off state, and generates the dead time for controlling a plurality of pulses having different widths to pulses having a constant width, which is output by the switching circuit.

6 Claims, 12 Drawing Sheets

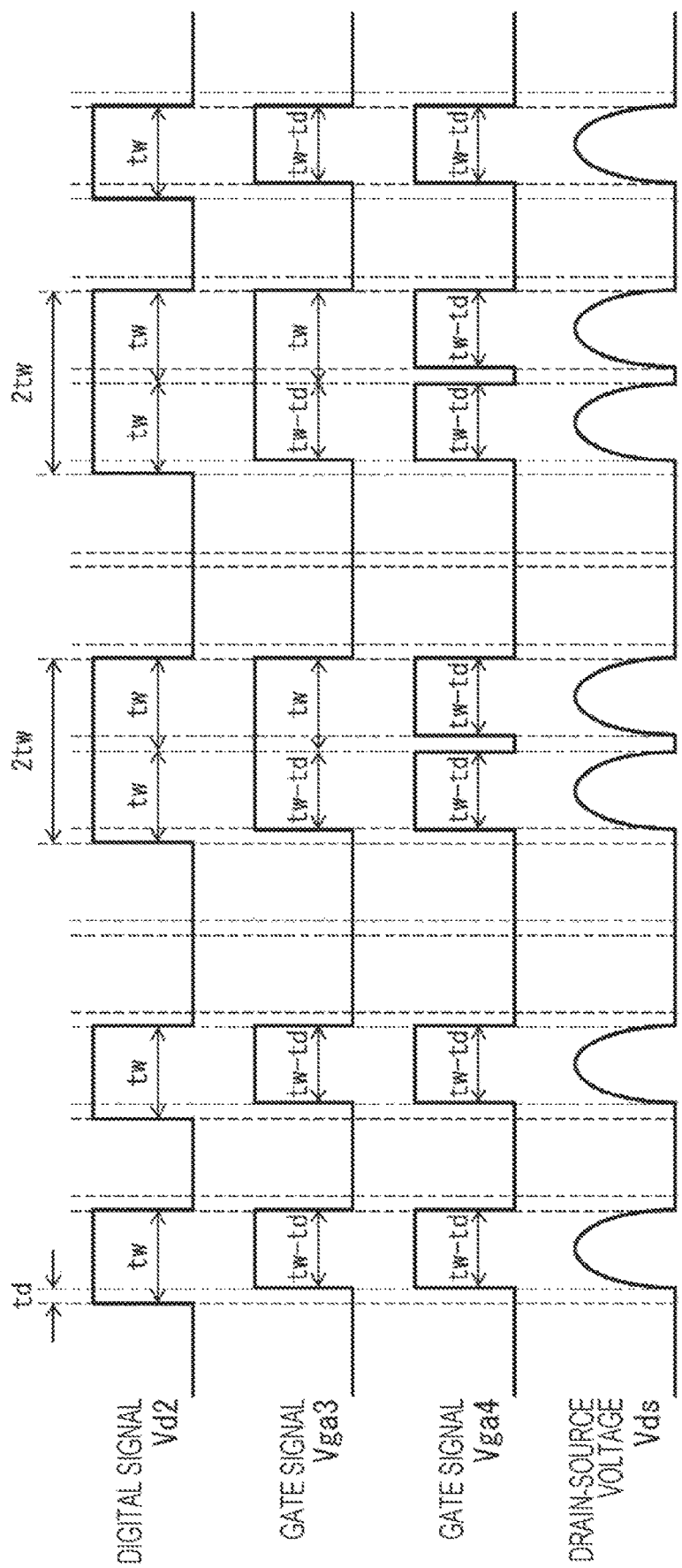

DEAD TIME GENERATOR AND DIGITAL SIGNAL PROCESSING DEVICE

TECHNICAL FIELD

The disclosure relates to a dead time generator and a digital signal processing device.

BACKGROUND ART

PTL 1 discloses an audio amplifier that receives a digital input signal and generates an output signal for driving a speaker. A class D amplifier included in the audio amplifier includes a modulator and a D modulator. The modulator is configured to receive the digital input signal and generate an n-bit semi-digital signal. The D modulator is configured to receive the n-bit semi-digital signal and to generate an output signal. The semi-digital signal is a signal of a semi-digital/semi-analog state.

CITATION LIST

Patent Literature

PTL 1: Japanese Unexamined Patent Application Publication (Translation of PCT Application) No. 2015-508980 (Mar. 23, 2015)

SUMMARY

Technical Problem

The audio amplifier disclosed in PTL 1 simply generates the n-bit semi-digital signal by the modulator and generates the output signal from the n-bit semi-digital signal. Therefore, the audio amplifier does not propose to reduce noise mixed in the output signal by controlling a plurality of pulses having different widths to pulses having a constant width.

An object of an aspect of the disclosure is to reduce noise mixed in an output signal by controlling a plurality of pulses having different widths to pulses having a constant width.

Solution to Problem

In order to solve the problem described above, a dead time generator according to one aspect of the disclosure is a dead time generator for generating a dead time in which gates of both of two switching elements included in a switching circuit are in an off state, in which the dead time is generated for controlling a plurality of pulses having different widths to pulses having a constant width, which is output from the switching circuit.

Advantageous Effects of Disclosure

According to an aspect of the disclosure, there is an effect that noise mixed in the output signal can be reduced by controlling a plurality of pulses having different widths to pulses having a constant width.

BRIEF DESCRIPTION OF DRAWINGS

In FIG. 4, (a) is a diagram illustrating the circuit of the clock synchronization signal generator, and (b) is a diagram illustrating the input/output waveforms of the clock synchronization signal generator.

In FIG. 5, (a) is a diagram illustrating the circuit of the clock synchronization signal generator, and (b) is a diagram illustrating the input/output waveforms of the clock synchronization signal generator.

In FIG. 6, (a) is a diagram illustrating the logic circuit of a gate drive circuit, and (b) is a diagram illustrating the input/output waveforms of the gate drive circuit and the switching circuit.

In FIG. 7, (a) is a diagram illustrating the logic circuit of the clock synchronization signal generator and the gate drive circuit, and (b) is a diagram illustrating the input/output waveforms of the clock synchronization signal generator and the gate drive circuit.

In FIG. 8, (a) is a diagram illustrating the logic circuit of the clock synchronization signal generator and the gate drive circuit, and (b) is a diagram illustrating the input/output waveforms of the clock synchronization signal generator and the gate drive circuit.

In FIG. 11, (a) is a diagram illustrating a current flow in a section of at illustrated in FIG. 10, (b) is a diagram illustrating a current flow in a section of bt illustrated in FIG. 10, (c) is a diagram illustrating a current flow in a section of et illustrated in FIG. 10, and (d) is diagram illustrating a current flow in a section of dt illustrated in FIG. 10, FIG. 12 is a diagram illustrating a switching circuit module and input/output waveforms of an output of a dead time generation circuit according to Embodiment 4 of the disclosure.

DESCRIPTION OF EMBODIMENTS

Embodiment 1

Figure 1:
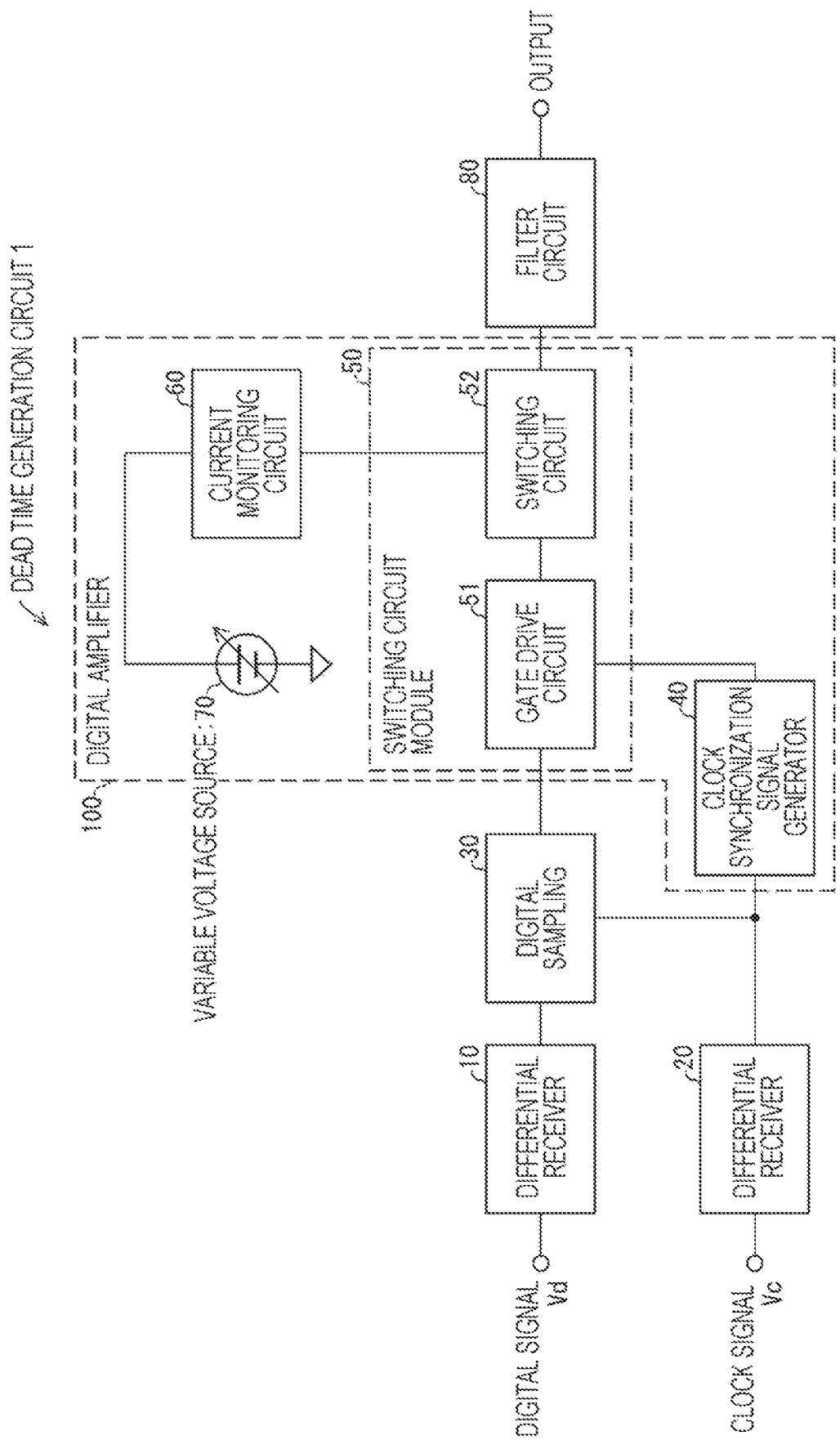
FIG. 1 is a block diagram illustrating a main configuration of a dead time generation circuit according to Embodiment 1 of the disclosure.
Figure 2:
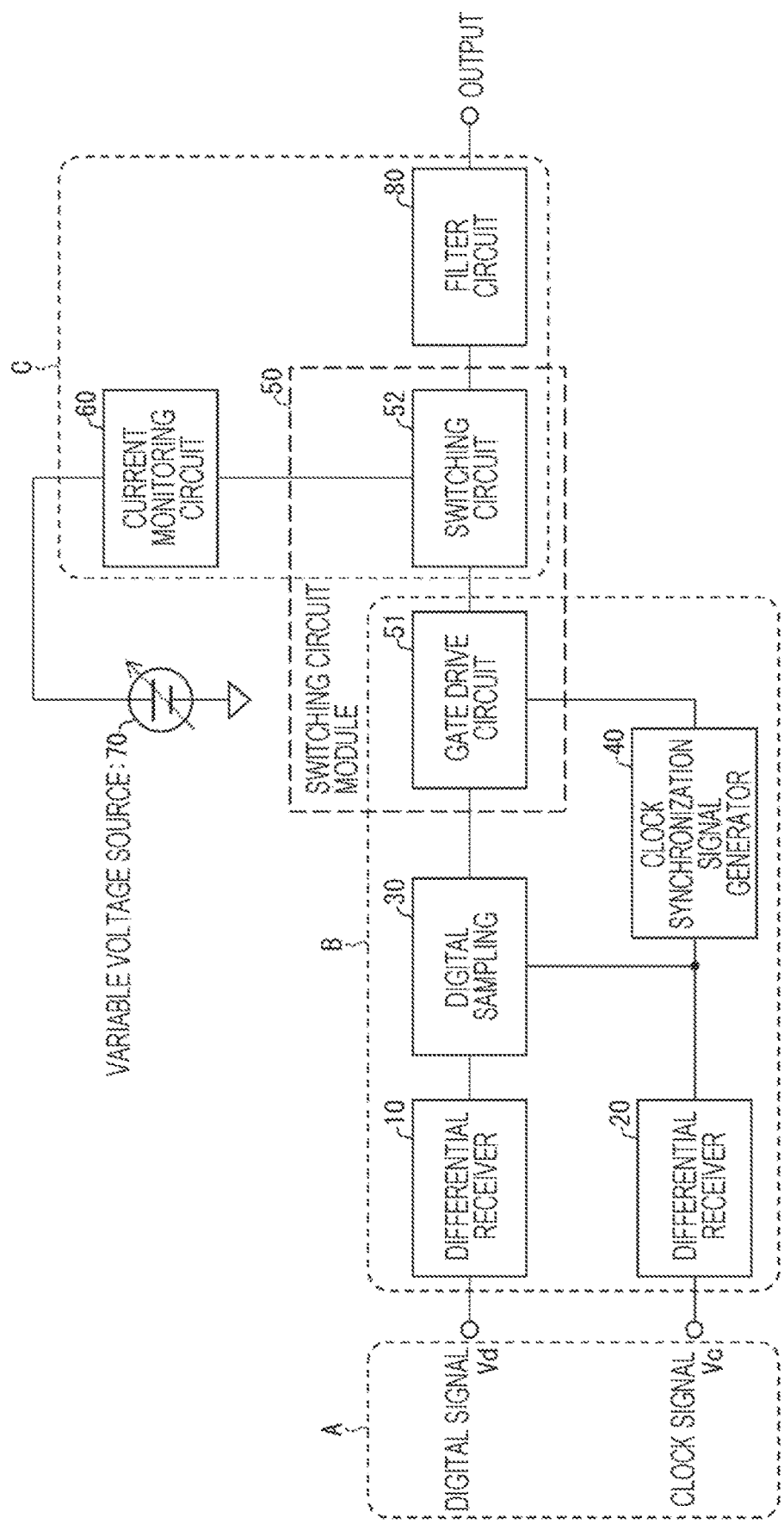
FIG. 2 is a block diagram illustrating a main configuration of the dead time generation circuit according to Embodiment 1 of the disclosure.

FIGS. 1 and 2 are block diagrams illustrating a main configuration of a dead time generation circuit 1 according to Embodiment 1 of the disclosure.

(Configuration of Dead Time Generation Circuit 1)

As illustrated in FIG. 1, the dead time generation circuit 1 (digital signal processing device) includes differential receivers 10 and 20, a digital sampling 30 (digital sampling circuit), a digital amplifier 100, and a filter circuit 80.

The digital amplifier 100 includes a clock synchronization signal generator 40 (dead time generator), a switching circuit module 50, a current monitoring circuit 60, and a variable voltage source 70. The digital amplifier 100 uses a signal of a pulse density modulation (PDM) system as an input signal. The digital amplifier 100 generates a dead time without changing a signal density of a signal before the dead time is generated. Therefore, noise of the signal of the PDM system can be directly amplified while the signal of the PDM system is reduced, in a digital signal state. In addition, the digital amplifier 100 is a full digital amplifier and is also a class D amplifier.

Noise generated in the digital amplifier 100 is classified into noise (noise generated in portion A in FIG. 2) due to quantization of the input signal, noise (noise generated in portion B in FIG. 2) due to signal conversion, and noise (noise generated in portion C of FIG. 2) generated in a power portion. The portion A of FIG. 2 is a portion for quantizing the input signal. The portion B of FIG. 2 is a portion including the differential receivers 10 and 20, the digital sampling 30, the clock synchronization signal generator 40, and the gate drive circuit 51 (drive circuit). The portion C of FIG. 2 is a portion including the switching circuit 52, the current monitoring circuit 60, and the filter circuit 80. The dead time generation circuit 1 is a circuit that reduces the noise due to the signal conversion by unifying all the pulses of the digital signal having a single pulse and a continuous pulse to pulses having the same pulse width as that of the single pulse. Therefore, the dead time generation circuit 1 is a circuit that reduces digital noise even when the dead time is generated. An operation of the switching circuit 52 always requires the dead time as a transition time.

A digital signal Vd is input to the differential receiver 10 as the input signal via two signal lines, and the differential receiver 10 supplies the digital signal Vd corresponding to a difference between the two signal lines to the digital sampling 30. A clock signal Vc is input to the differential receiver 20 via two signal lines, and the differential receiver 20 supplies the clock signal Vc corresponding to a difference between the two signal lines to the digital sampling 30 and the clock synchronization signal generator 40.

Figure 3:
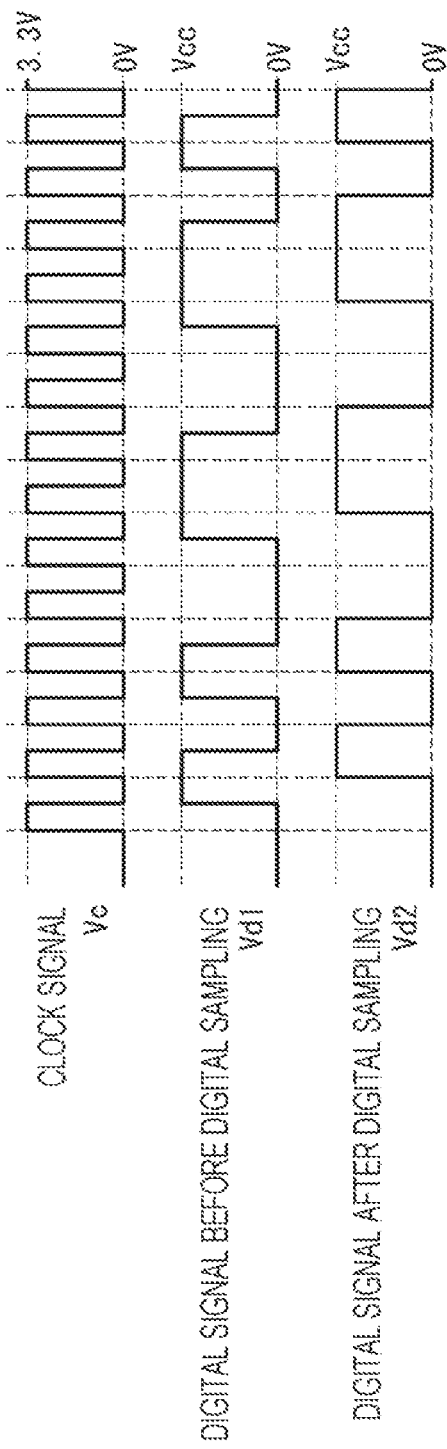
FIG. 3 is a diagram illustrating signal waveforms before and after digital sampling of the dead time generation circuit illustrated in FIG. 1.

The digital signal Vd supplied from the differential receiver 10 and the clock signal Vc supplied from the differential receiver 20 are input to the digital sampling 30. The digital sampling 30 is a circuit that performs digital sampling according to the digital signal Vd. Specifically, it will be described below based on FIG. 3. FIG. 3 is a diagram illustrating signal waveforms before and after the digital sampling 30 of the dead time generation circuit 1. As illustrated in FIG. 3, a digital signal Vd1 before the digital sampling does not coincide with rising of the clock signal Vc. The digital sampling 30 digitally samples the digital signal Vd1, so that the digital signal Vd1 is converted into a digital signal Vd2. Therefore, the digital signal Vd2 after the digital sampling is synchronized with the rising of the clock signal Vc. In other words, the digital sampling 30 causes a start point of time of the digital signal Vd input to the dead time generation circuit 1 to coincide with a rising start point of time of the clock signal Vc. The digital sampling 30 supplies the digital signal Vd2 to the gate drive circuit 51.

(Configuration of Clock Synchronization Signal Generator 40)

Figure 4:
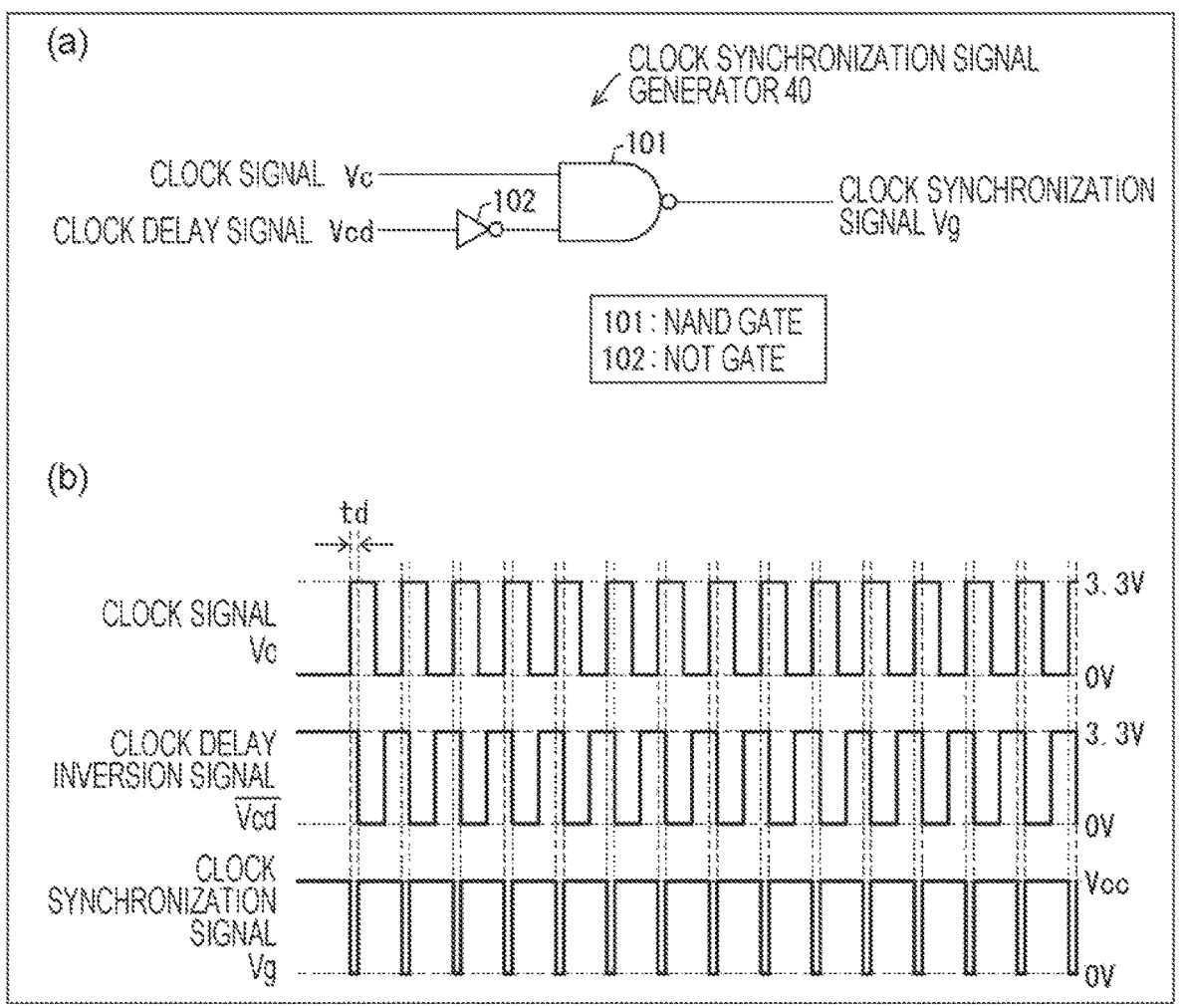
FIG. 4 is a diagram illustrating a circuit and input/output waveforms of a clock synchronization signal generator of the dead time generation circuit illustrated in FIG. 1.

The clock signal Vc supplied from the differential receiver 20 is input to the clock synchronization signal generator 40. The clock synchronization signal generator 40 generates a clock synchronization signal Vg based on the clock signal Vc, and supplies the clock synchronization signal Vg to the gate drive circuit 51. The clock synchronization signal generator 40 generates a dead time td. The dead time td will be described later. Specifically, it will be described below based on FIG. 4. FIG. 4 is a diagram illustrating a circuit and input/output waveforms of the clock synchronization signal generator 40 of the dead time generation circuit 1. In FIG. 4, (a) is a diagram illustrating the circuit of the clock synchronization signal generator 40, and (b) is a diagram illustrating the input/output waveforms of the clock synchronization signal generator 40. As illustrated in (a) of FIG. 4, the clock synchronization signal generator 40 includes a NAND gate 101, a NOT gate 102, and a delay circuit (not illustrated). The delay circuit delays the clock signal Vc by the dead time td based on the clock signal Vc. That is, the dead time td is synchronized with the clock signal Vc, and a start point of time of the dead time td coincides with the rising start point of time of the clock signal Vc. Therefore, the dead time can be generated at a constant cycle. The delay circuit supplies a clock delay signal Vcd obtained by delaying the clock signal Vc by the dead time td to the NAND gate 101 via the NOT gate 102. The NOT gate 102 inverts the clock delay signal Vcd and generates a clock delay inversion signal that is a signal having a phase opposite to that of the clock delay signal Vcd. The clock signal Vc supplied from the differential receiver 20 and the clock delay inversion signal supplied from the delay circuit via the NOT gate 102 are input to the NAND gate 101. The NAND gate 101 generates a clock synchronization signal Vg from the clock signal Vc and the clock delay inversion signal, and supplies the clock synchronization signal Vg to the gate drive circuit 51. That is, the clock synchronization signal Vg is a negative logical product of the clock signal Vc and the clock delay inversion signal.

The dead time td illustrated in (b) of FIG. 4 is a period called the dead time. The dead time td is a period during which both drive signals of two switching elements included in the switching circuit 52 are in an off state. Specifically, the dead time td is a period during which gates of both of the two switching elements included in the switching circuit 52 are in the off state. The dead time td is started simultaneously with the rising of the clock signal Vc. That is, simultaneously with the rising of the clock signal Vc, both of the two switching elements included in the switching circuit 52 are in the off state. As illustrated in (b) of FIG. 4, when voltages of both of the clock signal Vc and the clock delay inversion signal are 3.3 V (other voltage values may be used if the voltage value exceeds 0 V), the voltage of the clock synchronization signal Vg is 0 V. In addition, when the voltage of one of the clock signal Vc and the clock delay inversion signal is 0 V, the voltage of the clock synchronization signal Vg is Vcc (V) (Vcc>0 V).

The voltage of the clock synchronization signal Vg is 0 V at the dead time td, and is Vcc (V) other than the dead time td. That is, the dead time td is based on the clock synchronization signal Vg, and the dead time td is generated in a falling state of the clock synchronization signal Vg. Therefore, the dead time td can be generated only when the clock synchronization signal Vg is in the falling state. The pulse of the clock synchronization signal Vg is a pulse having a constant width. In addition, the period of the dead time td and the period in which the voltage of the clock synchronization signal Vg is 0 V are the same in time.

(Configuration of Clock Synchronization Signal Generator 40a)

Figure 5:
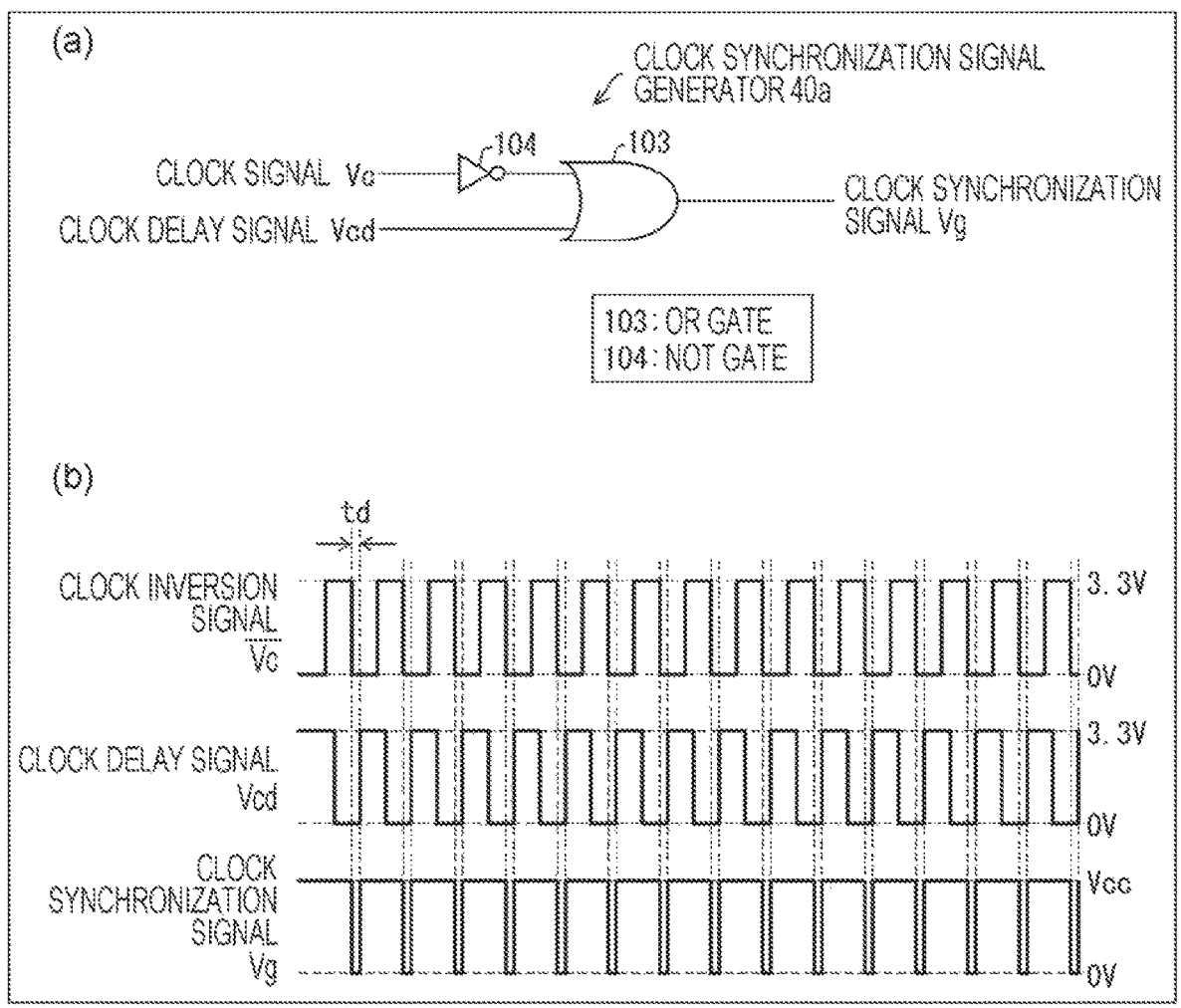
FIG. 5 is a diagram illustrating a circuit and input/output waveforms of the clock synchronization signal generator of the dead time generation circuit illustrated in FIG. 1.

FIG. 5 is a diagram illustrating a circuit and input/output waveforms of a clock synchronization signal generator 40a of the dead time generation circuit. In FIG. 5, (a) is a diagram illustrating a circuit of the clock synchronization signal generator 40a, and (b) is a diagram illustrating the input/output waveforms of the clock synchronization signal generator 40a. The dead time generation circuit 1 may be provided with the clock synchronization signal generator 40a instead of the clock synchronization signal generator 40. As illustrated in (a) of FIG. 5, the clock synchronization signal generator 40a includes an OR gate 103, a NOT gate 104, and a delay circuit (not illustrated). The delay circuit is the same as the delay circuit included in the clock synchronization signal generator 40. The clock signal Vc is inverted by the NOT gate 104, and a clock inversion signal that is a signal having a phase opposite to that of the clock signal Vc is generated. The delay circuit of the clock synchronization signal generator 40a supplies a clock delay signal Vcd obtained by delaying the clock signal Vc by the dead time td to the OR gate 103. The clock inversion signal supplied from the differential receiver 20 via the NOT gate 104 and the clock delay signal Vcd supplied from the delay circuit are input to the OR gate 103. The OR gate 103 generates the clock synchronization signal Vg from the clock inversion signal and the clock delay signal Vcd, and supplies the clock synchronization signal Vg to the gate drive circuit 51. That is, the clock synchronization signal Vg is a logical sum of the clock inversion signal and the clock delay signal Vcd.

As illustrated in (b) of FIG. 5, when voltages of both of the clock inversion signal and the clock delay signal Vcd are 0 V, the voltage of the clock synchronization signal Vg is 0 V. When the voltage of one of the clock inversion signal and the clock delay signal Vcd is 3.3 V (other voltage values may be used if the voltage value exceeds 0 V), the voltage of the clock synchronization signal Vg is Vcc (Vcc>0 V).

The voltage of the clock synchronization signal Vg is 0 V at the dead time td, and is Vcc (V) other than the dead time td. That is, the dead time td is based on the clock synchronization signal Vg, and the dead time td is generated in a falling state of the clock synchronization signal Vg. Therefore, the dead time td can be generated only when the clock synchronization signal Vg is in the falling state. The pulse of the clock synchronization signal Vg is a pulse having a constant width. In addition, the period of the dead time td and the period in which the voltage of the clock synchronization signal Vg is 0 V are the same in time.

The switching circuit module 50 includes a gate drive circuit 51 and a switching circuit 52. The switching circuit module 50 amplifies the digital signal according to a power supply voltage output from the variable voltage source 70 by driving two switching elements included in the switching circuit 52 by the gate drive circuit 51. The switching circuit module 50 supplies an amplified digital signal to the filter circuit 80.

The digital signal Vd2 supplied from the digital sampling 30 and the clock synchronization signal Vg supplied from the clock synchronization signal generator 40 are input to the gate drive circuit 51. The gate drive circuit 51 drives the two switching elements included in the switching circuit 52 based on the digital signal Vd and the clock synchronization signal Vg. Specifically, the gate drive circuit 51 turns off the gates of the two switching elements included in the switching circuit 52 during a period in which the clock synchronization signal Vg is 0 V.

The switching circuit 52 includes the two switching elements. The two switching elements are switching elements configured to be made of, for example, a compound semiconductor. In addition, the two switching elements may be field effect transistors (FETs).

The current monitoring circuit 60 is a protection circuit that monitors a current flowing through the two switching elements included in the switching circuit 52. The variable voltage source 70 is a voltage source for supplying a power supply voltage for the switching circuit 52 to amplify the voltage. An output voltage of the switching circuit 52 is adjusted by changing the voltage supplied by the variable voltage source 70.

The filter circuit 80 extracts a specific frequency component from the digital signal output from an output side (output side of the switching circuit module 50) of the digital amplifier 100. The filter circuit 80 supplies an extracted specific frequency component of the digital signal to an output device such as a speaker outside the dead time generation circuit 1.

Embodiment 2

Figure 6:
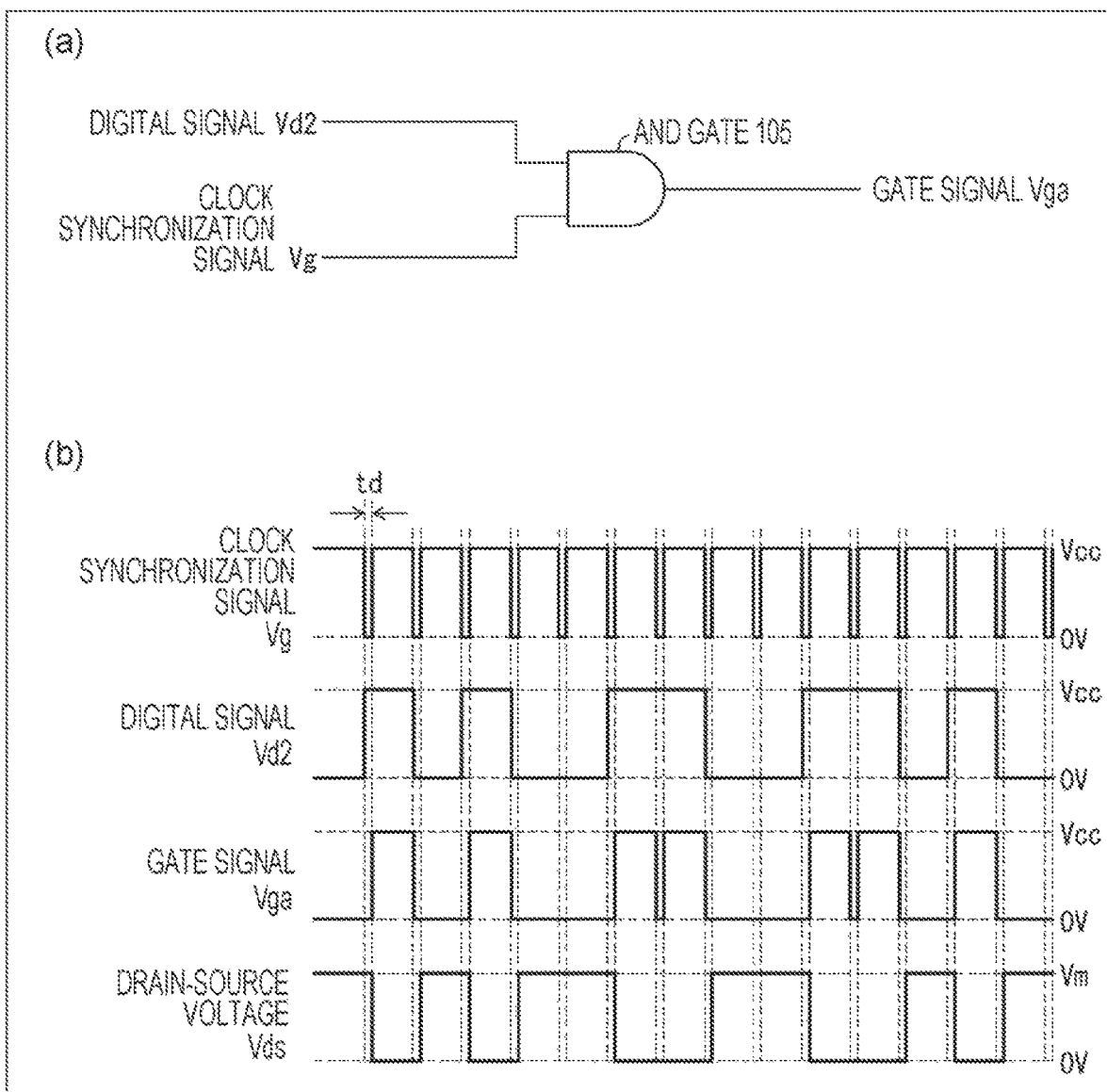
FIG. 6 is a diagram illustrating a logic circuit of a gate drive circuit, and input/output waveforms of a gate drive circuit and a switching circuit of a dead time generation circuit according to Embodiment 2 of the disclosure.

Here, for convenience of explanation, members having the same functions as those described in the embodiment described above are denoted by the same reference numerals and description thereof is omitted. FIG. 6 is a diagram illustrating a logic circuit of a gate drive circuit 51, and input/output waveforms of the gate drive circuit 51 and a switching circuit 52 of a dead time generation circuit 1 according to Embodiment 2 of the disclosure. FIG. 6, (a) is a diagram illustrating the logic circuit of the gate drive circuit 51, and (b) is a diagram illustrating the input/output waveforms of the gate drive circuit 51 and the switching circuit 52.

An AND gate 105 is a logic circuit corresponding to the gate drive circuit 51. As illustrated in (a) of FIG. 6, a digital signal Vd2 supplied from a digital sampling 30 and a clock synchronization signal Vg supplied from a clock synchronization signal generator 40 are input to the AND gate 105. The AND gate 105 generates a gate signal Vga (drive signal) from the digital signal Vd2 and the clock synchronization signal Vg, and supplies the gate signal Vga to the switching circuit 52. That is, the gate signal Vga is a logical product of the digital signal Vd2 and the clock synchronization signal Vg.

As illustrated in (b) of FIG. 6, there are two types of time widths of pulses in a waveform of the digital signal Vd2. In the two types of the time widths of the pulses, a time width of a larger pulse is twice a time width of a smaller pulse. This is because, in the signal of the PDM system, voice information is represented by a pulse density, so that a logical value of the signal of the PDM system is 0 or 1 (1 bit). When a voltage of one of the clock synchronization signal Vg and the digital signal Vd2 is 0 V, the voltage of the gate signal Vga is 0 V. Further, when the voltages of both of the clock synchronization signal Vg and the digital signal Vd2 are Vcc (V) (Vcc>0 V), the voltage of the gate signal Vga is Vcc (V). The pulse of the gate signal Vga is a pulse having a constant width. Further, during a period of the dead time td, the voltage of the gate signal Vga is always 0 V. By synthesizing the digital signal Vd2 and the clock synchronization signal Vg, the continuous pulse of the digital signal Vd2 is divided, and a balance of the pulse density of the gate signal Vga is not lost. That is, the digital signal Vd2 having the single pulse and the continuous pulse is converted into the gate signal Vga in which the time widths of all the pulses are the same as that of the single pulse. Therefore, the dead time td is a period for controlling a plurality of pulses having different widths input to the dead time generation circuit 1 to pulses having a constant width output from the switching circuit 52. When the gate signal Vga is supplied to the switching circuit 52, a waveform of a drain-source voltage Vds of the switching circuit 52 is a waveform as illustrated in (b) of FIG. 6. For Vm, Vm>0.

As described above, the gate signal Vga can be output based on the digital signal Vd2, and the gate signal Vga can be set to 0 V during the dead time td generates. In addition, the pulse of the gate signal Vga is a pulse having a constant width. Therefore, by controlling a plurality of pulses having different widths to the pulses having the constant width, the time width of the pulse is not unbalanced, so that noise mixed in the gate signal Vga can be reduced.

Further, when the gate signal Vga, which is the pulse signal having the constant width, is supplied to the switching circuit 52, the switching circuit 52 can output an output signal that is a pulse having a constant width. Therefore, by controlling a plurality of pulses having different widths to pulses having a constant width, the time width of the pulse is not unbalanced, so that noise mixed in the output signal can be reduced. Further, for example, in a case of a digital amplifier connected by a bridged-tied load (BTL), an offset voltage is generated in a negative direction due to a shortened time width of the pulse. Therefore, by controlling the plurality of pulses having different widths to the pulses having the constant width, it acts as a DC dither, so that noise can be prevented from being generated. Further, the offset voltage is canceled by the BTL connection.

Figure 7:
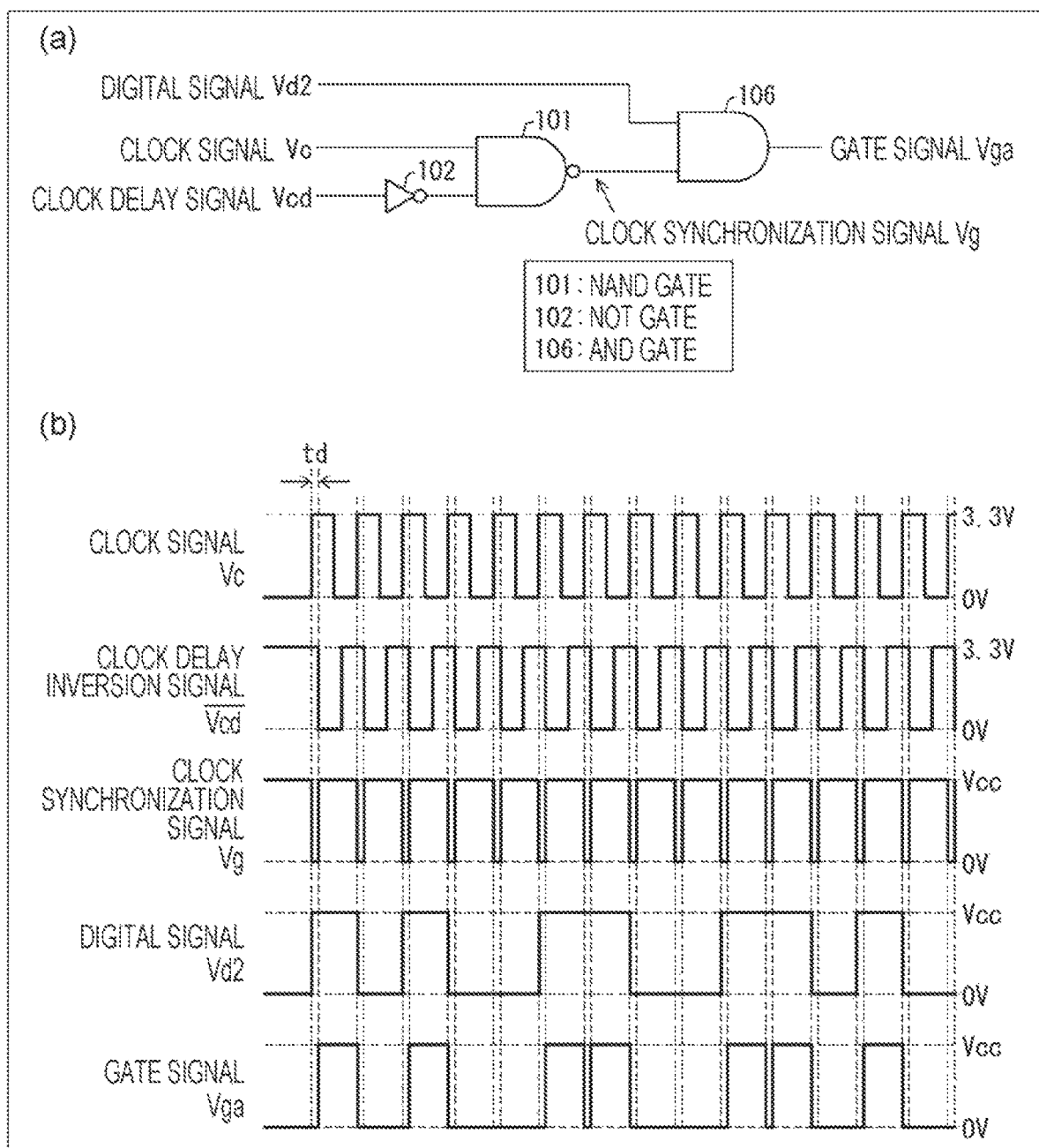
FIG. 7 is a diagram illustrating a logic circuit and input/output waveforms of a clock synchronization signal generator and a gate drive circuit of a dead time generation circuit according to Embodiment 2 of the disclosure.

FIG. 7 is a diagram illustrating a logic circuit and input/output waveforms of the clock synchronization signal generator 40 and the gate drive circuit 51 of the dead time generation circuit 1 according to Embodiment 2 of the disclosure. In FIG. 7, (a) is a diagram illustrating the logic circuit of the clock synchronization signal generator 40 and the gate drive circuit 51, and (b) is a diagram illustrating the input/output waveforms of the clock synchronization signal generator 40 and the gate drive circuit 51.

The AND gate 106 is a logic circuit corresponding to the gate drive circuit 51, and the NAND gate 101 and the NOT gate 102 are logic circuits corresponding to the clock synchronization signal generator 40. As illustrated in (a) of FIG. 7, the digital signal Vd2 supplied from the digital sampling 30 and the clock synchronization signal Vg supplied from the NAND gate 101 are input to the AND gate 106. Circuit configurations of the NAND gate 101 and the NOT gate 102 are the same as the circuit configurations illustrated in (a) of FIG. 4. The AND gate 106 generates the gate signal Vga from the digital signal Vd2 and the clock synchronization signal Vg, and supplies the gate signal Vga to the switching circuit 52. That is, the gate signal Vga is a logical product of the digital signal Vd2 and the clock synchronization signal Vg.

In (b) of FIG. 7, the clock signal Vc, the clock delay inversion signal, and the clock synchronization signal Vg have the same waveforms as those illustrated in (b) of FIG. 4. As illustrated in (b) of FIG. 7, when one of the clock synchronization signal Vg and the digital signal Vd2 is 0 V, the voltage of the gate signal Vga is 0 V. Further, when the voltages of both of the clock synchronization signal Vg and the digital signal Vd2 are Vcc (V) (Vcc>0 V), the voltage of the gate signal Vga is Vcc (V). In addition, the pulse of the gate signal Vga is a pulse having a constant width. Further, during a period of the dead time td, the voltage of the gate signal Vga is always 0 V. By synthesizing the digital signal Vd2 and the clock synchronization signal Vg, the continuous pulse of the digital signal Vd2 is divided, and a balance of the pulse density of the gate signal Vga is not lost. That is, the digital signal Vd2 having the single pulse and the continuous pulse is converted into the gate signal Vga in which the time widths of all the pulses are the same as that of the single pulse. Further, the dead time td can be generated by reducing a certain amount of the signal density of the digital signal Vd2 by the amount corresponding to the dead time td from the digital signal Vd2 before the dead time is generated.

Figure 8:
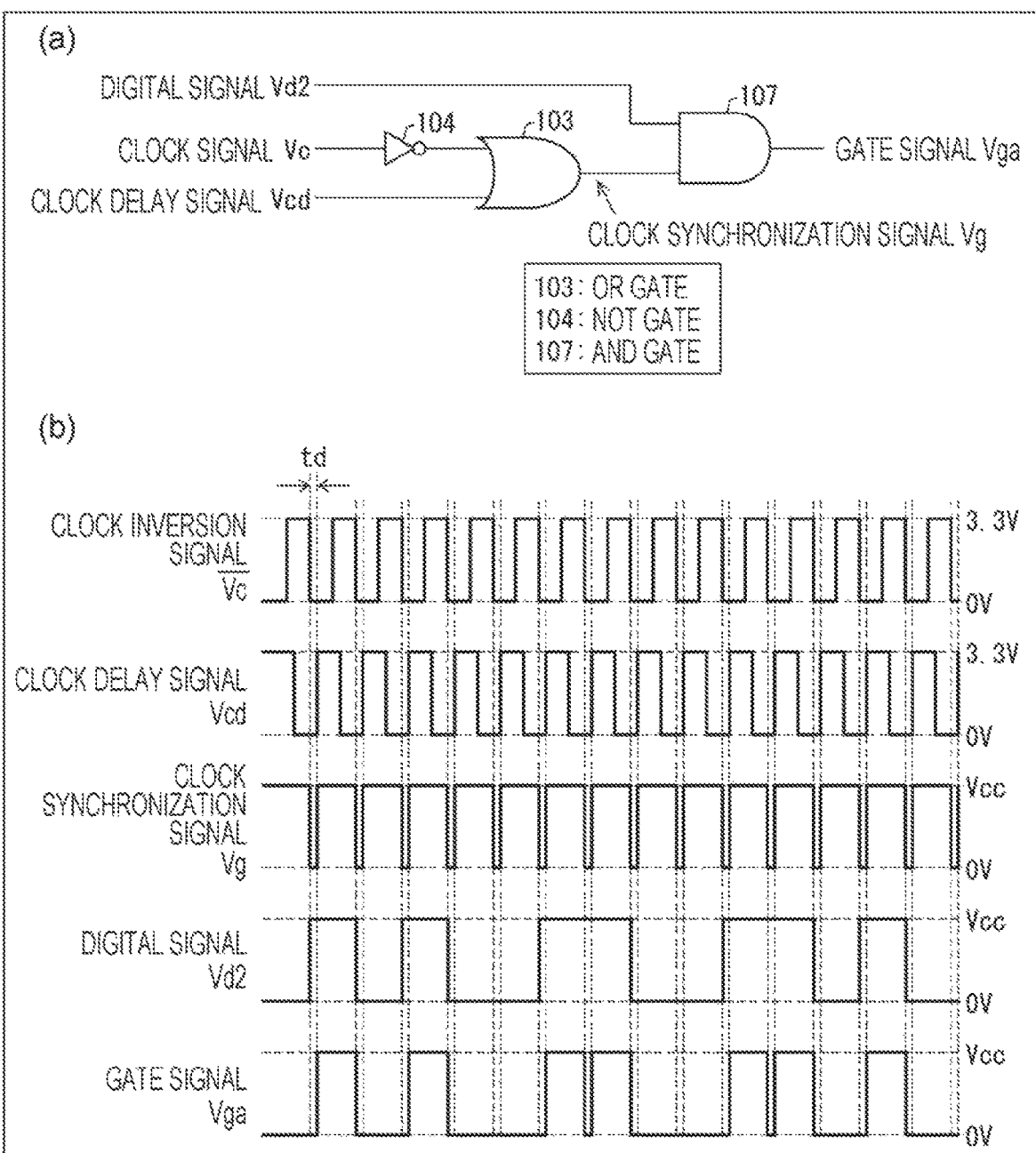
FIG. 8 is a diagram illustrating a logic circuit and input/output waveforms of a clock synchronization signal generator and a gate drive circuit of a dead time generation circuit according to Embodiment 2 of the disclosure.

FIG. 8 is a diagram illustrating a logic circuit and input/output waveforms of the clock synchronization signal generator 40 and the gate drive circuit 51 of the dead time generation circuit 1 according to Embodiment 2 of the disclosure. In FIG. 8, (a) is a diagram illustrating the logic circuit of the clock synchronization signal generator 40 and the gate drive circuit 51, and (b) is a diagram illustrating the input/output waveforms of the clock synchronization signal generator 40 and the gate drive circuit 51.

The logic circuit of the clock synchronization signal generator 40 and the gate drive circuit 51 illustrated in (a) of FIG. 7 is also illustrated in a circuit illustrated in (a) of FIG. 8 according to a De Morgan's law. The AND gate 107 is a logic circuit corresponding to the gate drive circuit 51, and the OR gate 103 and the NOT gate 104 are a logic circuit corresponding to the clock synchronization signal generator 40. As illustrated in (a) of FIG. 8, the digital signal Vd2 supplied from the digital sampling 30 and the clock synchronization signal Vg supplied from the OR gate 103 are input to the AND gate 107. Circuit configurations of the OR gate 103 and the NOT gate 104 are the same as those illustrated in (a) of FIG. 5. The AND gate 107 generates the gate signal Vga from the digital signal Vd2 and the clock synchronization signal Vg, and supplies the gate signal Vga to the switching circuit 52. That is, the gate signal Vga is a logical product of the digital signal Vd2 and the clock synchronization signal Vg.

In (b) of FIG. 8, the clock inversion signal, the clock delay signal Vcd, and the clock synchronization signal Vg have the same waveforms as those illustrated in (b) of FIG. 5. As illustrated in (b) of FIG. 8, the voltage of the gate signal Vga is 0 V when the voltage of one of the clock synchronization signal Vg and the digital signal Vd2 is 0 V. Further, when the voltages of both of the clock synchronization signal Vg and the digital signal Vd2 are Vcc (V) (Vcc>0 V), the voltage of the gate signal Vga is Vcc (V). In addition, the pulse of the gate signal Vga is a pulse having a constant width. Further, during a period of the dead time td, the voltage of the gate signal Vga is always 0 V. By synthesizing the digital signal Vd2 and the clock synchronization signal Vg, the continuous pulse of the digital signal Vd2 is divided, and a balance of the pulse density of the gate signal Vga is not lost. That is, the digital signal Vd2 having the single pulse and the continuous pulse is converted into the gate signal Vga in which the time widths of all the pulses are the same as that of the single pulse.

Embodiment 3

Figure 9:
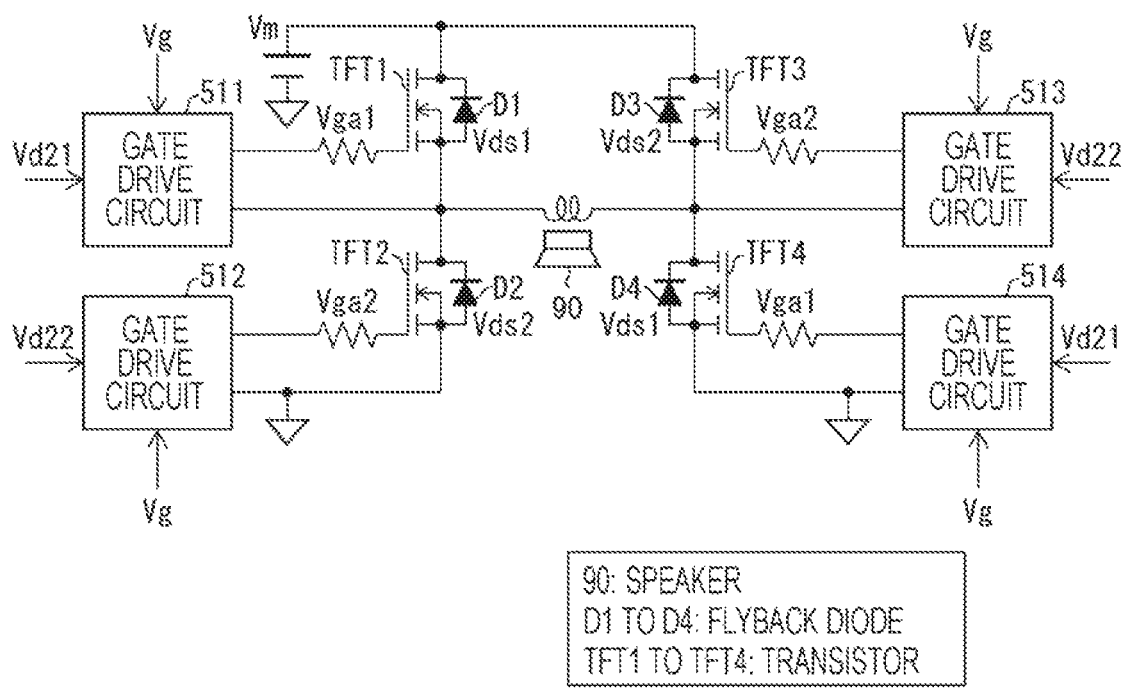
FIG. 9 is a diagram illustrating a switching circuit module and an output circuit of a dead time generation circuit according to Embodiment 3 of the disclosure.
Figure 10:
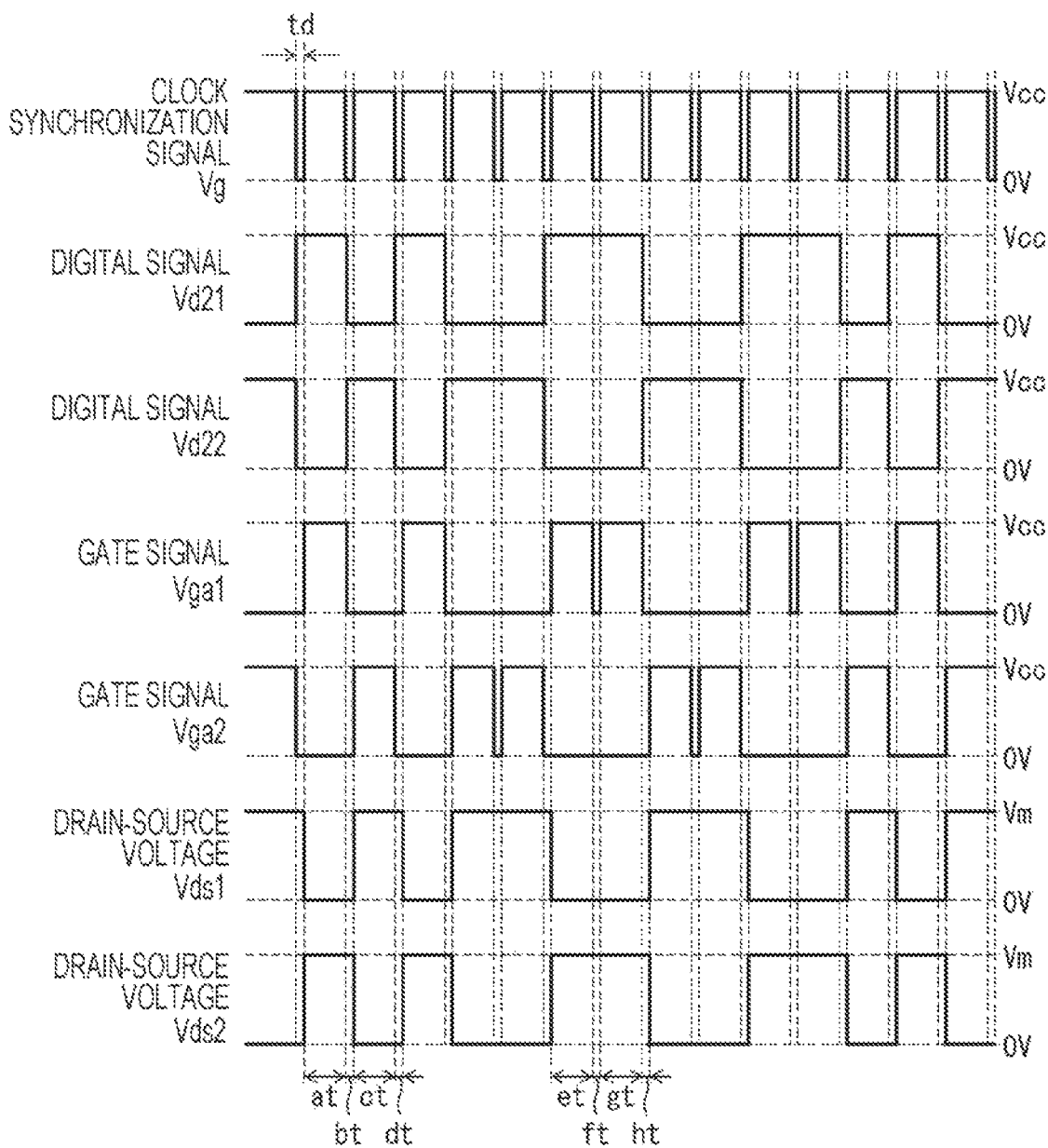
FIG. 10 is a diagram illustrating a switching circuit module and input/output waveforms of an output of a dead time generation circuit according to Embodiment 3 of the disclosure.
Figure 11:
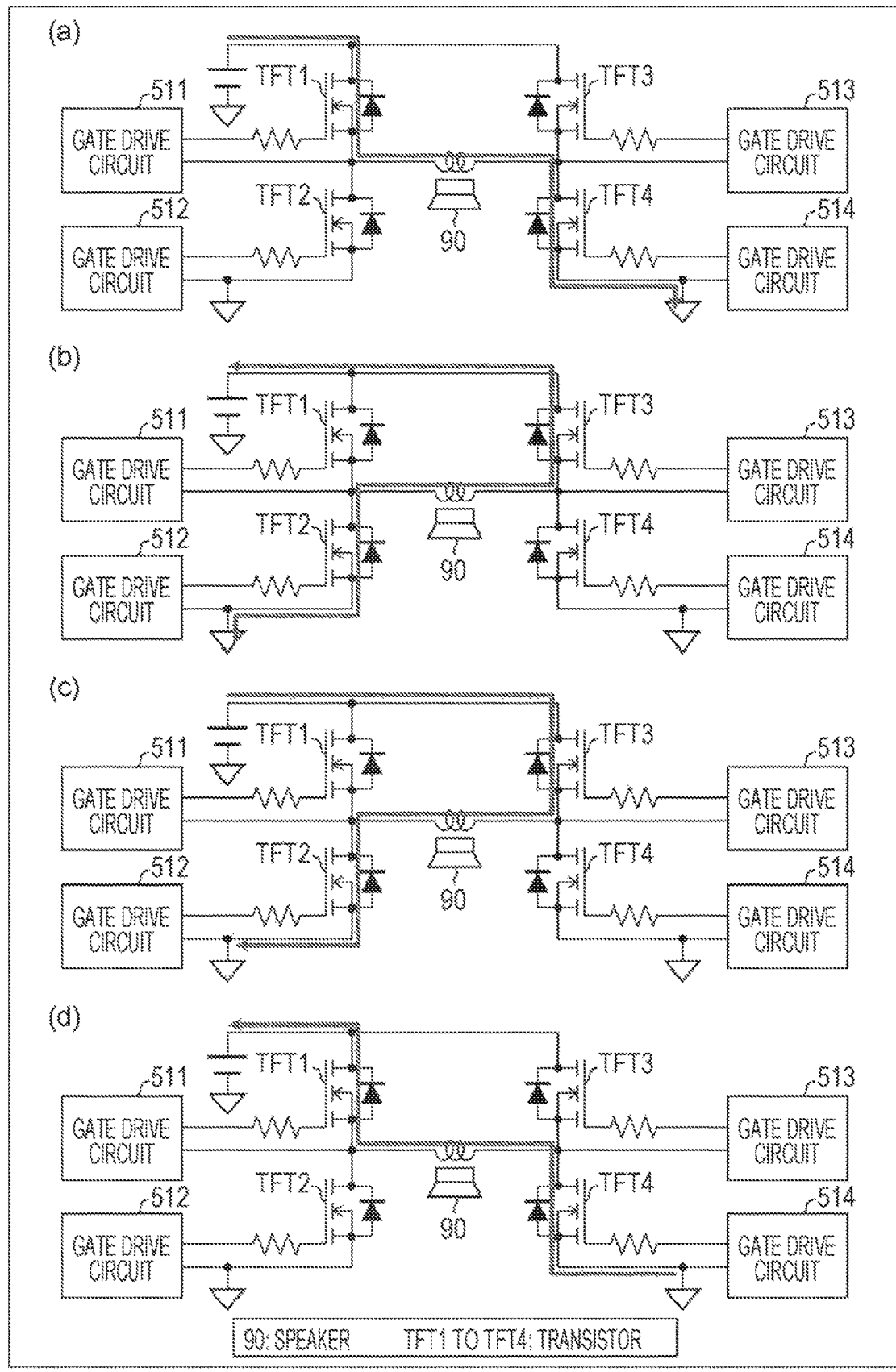
FIG. 11 is a diagram illustrating a switching circuit module and an output current flow of a dead time generation circuit according to Embodiment 3 of the disclosure.

Here, for convenience of explanation, members having the same functions as those described in the embodiment described above are denoted by the same reference numerals and description thereof is omitted. FIG. 9 is a diagram illustrating a switching circuit module 50 and an output circuit of the dead time generation circuit 1 according to Embodiment 3 of the disclosure. FIG. 10 is a diagram illustrating the switching circuit module 50 and input/output waveforms of the output of the dead time generation circuit 1 according to Embodiment 3 of the disclosure. FIG. 11 is a diagram illustrating the switching circuit module 50 and a current flow of the output of the dead time generation circuit 1 according to Embodiment 3 of the disclosure. In FIG. 11, (a) is a diagram illustrating a current flow in a section of at illustrated in FIG. 10, and (h) is a diagram illustrating a current flow in the section of bt illustrated in FIG. 11, In FIG. 11, (c) is a diagram illustrating a current flow in a section of ct illustrated in FIG. 10, and (d) is a diagram illustrating a current flow in a section of dt illustrated in FIG. 10.

Embodiment 3 is premised on the following description. The switching circuit module 50 corresponds to a portion obtained by removing the speaker 90 from the circuit illustrated in FIG. 9. The circuit illustrated in FIG. 9 is a half bridge circuit. The gate drive circuit 51 corresponds to gate drive circuits 511 to 514. Each of the gate drive circuits 511 to 514 includes a power source for operating itself. The switching circuit 52 corresponds to transistors TFT1 to TFT4. The output of the dead time generation circuit 1 illustrated in FIG. 1 corresponds to the speaker 90. Unlike Embodiment 1, the switching circuit 52 includes the transistors TFT1 to TFT4 which are four switching elements.

The clock synchronization signal Vg from the clock synchronization signal generator 40 and the digital signal Vd21 from the digital sampling 30 are respectively input to the gate drive circuit 511 and the gate drive circuit 514. The gate drive circuit 511 supplies a gate signal Vga1 that is a logical product of the clock synchronization signal Vg and the digital signal Vd21 to the transistor TFT1. The gate drive circuit 514 supplies the gate signal Vga1 to the transistor TFT4. That is, the gate drive circuit 511 drives the transistor TFT1, and the gate drive circuit 514 drives the transistor TFT4.

The clock synchronization signal Vg from the clock synchronization signal generator 40 and the digital signal Vd22 from the digital sampling 30 are respectively input to the gate drive circuit 512 and the gate drive circuit 513. The digital signal Vd22 is a signal obtained by inverting the digital signal Vd21 by a NOT gate (not illustrated) included in the digital sampling 30, and is a signal having a phase opposite to that of the digital signal Vd21. The NOT gate obtained by inverting the digital signal Vd21 may not be provided in the digital sampling 30, and may be provided in another place. The gate drive circuit 512 supplies a gate signal Vga2 that is a logical product of the clock synchronization signal Vg and the digital signal Vd22 to the transistor TFT2. The gate drive circuit 513 supplies the gate signal Vga2 to the transistor TFT3. That is, the gate drive circuit 512 drives the transistor TFT2, and the gate drive circuit 513 drives the transistor TFT3.

The speaker 90 can output sound by controlling the transistors TFT1 to TFT4 by the gate drive circuits 511 to 514. Another output device may be provided in place of the speaker 90 instead of the speaker 90.

As illustrated in FIG. 10, when the voltage of one of the clock synchronization signal Vg and the digital signal Vd21 is 0 V, the voltage of the gate signal Vga1 is 0 V. Further, when the voltages of both of the clock synchronization signal Vg and the digital signal Vd21 are Vcc (V) (Vcc>0 V), the voltage of the gate signal Vga1 is Vcc (V). The pulse of the gate signal Vga1 is a pulse having a constant width. In the period of the dead time td, the voltage of the gate signal Vga1 is always 0 V. By synthesizing the digital signal Vd21 and the clock synchronization signal Vg, the continuous pulse of the digital signal Vd21 is divided, and the balance of the pulse density of the gate signal Vga1 is not lost. That is, the digital signal Vd21 having a single pulse and a continuous pulse is converted into a gate signal Vga1 in which the time width of all the pulses is the same as that of the single pulse.

When the voltage of one of the clock synchronization signal Vg and the digital signal Vd22 is 0 V, the voltage of the gate signal Vga2 is 0 V. Further, when the voltages of both of the clock synchronization signal Vg and the digital signal Vd22 are Vcc (V) (Vcc>0 V), the voltage of the gate signal Vga2 is Vcc (V). The pulse of the gate signal Vga2 is a pulse having a constant width. Further, in the period of the dead time td, the voltage of the gate signal Vga2 is always 0 V. By synthesizing the digital signal Vd22 and the clock synchronization signal Vg, the continuous pulse of the digital signal Vd22 is divided, and the balance of the pulse density of the gate signal Vga2 is not lost. That is, the digital signal Vd22 having the single pulse and the continuous pulse is converted into the gate signal Vga2 in which the time width of all the pulses is the same as that of the single pulse.

There are two types of sizes of the time width of the pulse in the waveforms of the drain-source voltages Vds1 and Vds2. In the two types of the time widths of the pulses, a time width of a larger pulse is twice a time width of a smaller pulse. The drain-source voltage Vds1 is a voltage between the drain sources of the transistor TFT1 and the transistor TFT4, and the drain-source voltage Vds2 is a voltage between the drain sources of the transistor TFT2 and the transistor TFT3.

In the section of at illustrated in FIG. 10, the gate signal Vga1 is Vcc (V) (Vcc>0 V), and the gate signal Vga2 is 0 V. Therefore, the transistor TFT1 and the transistor TFT4 are in an on state, and the transistor TFT2 and the transistor TFT3 are in an off state. Therefore, the current flows as illustrated by an arrow in (a) of FIG. 11. That is, the current flows in the order of the transistor TFT1, the speaker 90, and the transistor TFT4. Therefore, the drain-source voltage Vds1 is 0 V, and the drain-source voltage Vds2 is Vm (V) (Vm>0).

In the section of bt illustrated in FIG. 10, the gate signal Vga1 and the gate signal Vga2 are 0 V. Therefore, the transistors TFT1 to TFT4 are in the off state. In addition, since the drain-source voltage Vds2 is Vm (V) in the section of at, the state in which the drain-source voltage Vds2 is Vm (V) is also maintained in the section of bt. This is because, in the section of bt, a voltage of the drain-source voltage Vds2 is substantially maintained by output capacitances of the transistors TFT2 and TFT3. Therefore, in the section of bt, a current flows through a flyback diode D2 connected between both terminals of the transistor TFT2 and a flyback diode D3 connected between both terminals of the transistor TFT3. Therefore, the current flows as illustrated by an arrow in (b) of FIG. 11. That is, the current flows in the order of the flyback diode D2, the speaker 90, and the flyback diode D3.

In the section of ct illustrated in FIG. 10, the gate signal Vga1 is 0 V, and the gate signal Vga2 is Vcc (V) (Vcc>0 V). Therefore, the transistor TFT2 and the transistor TFT3 are in the on state, and the transistor TFT1 and the transistor TFT4 are in the off state. Therefore, the current flows as illustrated by an arrow in (c) of FIG. 11. That is, the current flows in the order of the transistor TFT3, the speaker 90, and the transistor TFT2. Therefore, the drain-source voltage Vds1 is Vm (V) (Vm>0), and the drain-source voltage Vds2 is 0 V.

In the section of dt illustrated in FIG. 10, the gate signal Vga1 and the gate signal Vga2 are 0 V. Therefore, the transistors TFT1 to TFT4 are in the off state. Further, in the section of ct, since the drain-source voltage Vds1 is Vm (V), in the section of dt, the state in which the drain-source voltage Vds1 is Vm (V) is also maintained. This is because, in the section of dt, the voltage of the drain-source voltage Vds1 is substantially maintained by the output capacitances of the transistor TFT1 and the transistor TFT4. Therefore, in the section of dt, the current flows through the flyback diode D1 connected between both terminals of the transistor TFT1 and the flyback diode D4 connected between both terminals of the transistor TFT4. Therefore, the current flows as illustrated by an arrow in (d) of FIG. 11. That is, the current flows in the order of the flyback diode D4, the speaker 90, and the flyback diode D1.

In the sections of et and ft illustrated in FIG. 10, the same operations as those of the sections of at and bt are performed. Further, in sections of gt and ht illustrated in FIG. 10, the same operations as those in the sections at and bt are performed. That is, in the sections from et to ht, the same operations as those in the section of at and bt are performed twice. Therefore, in a case in which the drain-source voltage is the continuous pulse, the same operation is continued by the number of time widths of the single pulse. Therefore, even in a case in which the drain-source voltage is the continuous pulse, an offset voltage of the output can be suppressed and noise can be reduced by iterating the same operation as that of the single pulse.

Further, the drain-source voltage Vds1 and the drain-source voltage Vds2 are input to the speaker 90 as output signals of the switching circuit 52. However, during the dead time td, the current flows backward through the flyback diodes D1 to D4, so that the output signal of the switching circuit 52 is a pulse having a constant width. Specifically, in the waveforms of the drain-source voltage Vds1 and the drain-source voltage Vds2 illustrated in FIG. 10, except for a portion corresponding to the dead time td, the drain-source voltage Vds1 and the drain-source voltage Vds have the pulse of the constant width. Therefore, a plurality of pulses having different widths are controlled to pulses having the constant width. Therefore, since the time width of the pulse is not unbalanced, noise mixed in the output signal can be reduced.

As described above, each gate drive circuit of the half bridge circuit illustrated in FIG. 9 outputs a gate signal based on the clock synchronization signal Vg on both a high side and a low side. The high side is an upper half portion (portion including the gate drive circuits 511 and 513, and the transistors TFT1 and TFT3) of the half bridge circuit.

The low side is a lower half portion (portion including the gate drive circuits 512 and 514, and the transistors TFT2 and TFT4) of the half bridge circuit.

Embodiment 4

Here, for convenience of explanation, members having the same functions as those described in the embodiment described above are denoted by the same reference numerals and description thereof is omitted. FIG. 12 is a diagram illustrating a switching circuit module 50 and input/output waveforms of an output of a dead time generation circuit 1 according to Embodiment 4 of the disclosure.

In FIG. 12, a gate signal Vga3 is a gate signal synchronized with a digital signal Vd2 in the disclosure of the related ark. A gate signal Vga4 is a gate signal in a case in which the dead time td is generated for each clock.

As illustrated in FIG. 12, the dead time td is required as a transition time associated with the switching operation of the switching circuit 52 with respect to the digital signal Vd2 input to the gate drive circuit 51. In the case of the gate signal Vga3, there is no transition time in a second half of the gate signal Vga3 with respect to a pulse having a time width of 2 tw. That is, the time width of a first half of the gate signal Vga3 is tw−td, whereas the time width of the second half of the gate signal Vga3 is tw, and the dead time td as the transition time in the second half of the gate signal Vga3 does not exist.

When the dead time td is generated with respect to the rising transition of the digital signal Vd2, in a case in which a pulse having a time width of 2tw of the digital signal Vd2 comes, the time width of the pulse of the gate signal Vga3 is 2tw−td. In this case, an average of the time widths of the pulse of the gate signal Vga3 per clock is tw−td/2. On the other hand, in a case in which a pulse having the time width of tw of the digital signal Vd2 comes, the average of the time widths of the pulse of the gate signal Vga3 per clock is tw. Therefore, when comparing a case in which the pulse having the time width of 2tw of the digital signal Vd2 comes to a case in which the pulse having the time width of tw of the digital signal Vd2, the average of the time widths of the pulse of the gate signal Vga3 per clock is not directly proportional. Therefore, the gate signal Vga3 is distorted.

On the other hand, in the case of the gate signal Vga4, the average of the time widths of the pulse of the gate signal Vga4 per clock is all tw, and is directly proportional to the digital signal Vd2. The offset voltage decreases by the time width of td/tw in a potential direction on the low side of the half bridge circuit illustrated in FIG. 9, but the offset voltage is canceled by the BTL connection. In addition, since the time width of the pulse is single, the switching circuit 52 can perform resonant switching, and can be applied to a class E amplifier. By using the resonance circuit, an output by the single pulse can be obtained like the drain-source voltage Vds illustrated in FIG. 12. Further high frequency and high efficiency can be achieved by performing soft switching drive.

SUMMARY

The dead time generator (clock synchronization signal generators 40 and 40a) according to Aspect 1 of the disclosure is the dead time generator that generates the dead time in which the gates of both of the two switching elements included in the switching circuit 52 are in the off state. The dead time generator generates the dead time for controlling the plurality of pulses having different widths to the pulses having the constant width output from the switching circuit.

According to the configuration described above, the plurality of pulses having different widths are controlled to the pulses having the constant width. Therefore, since the time width of the pulse is not unbalanced, noise mixed in the output signal can be reduced.

The dead time generator (clock synchronization signal generators 40 and 40a) according to Aspect 2 of the disclosure, in Aspect 1, in which the dead time may be synchronized with the clock signal input to the dead time generator.

According to the configuration described above, the dead time is synchronized with the clock signal input to the dead time generator. Therefore, the dead time can be generated at a constant cycle.

The dead time generator (clock synchronization signal generators 40 and 40a) according to Aspect 3 of the disclosure, in Aspect 2, in which the dead time may be based on the clock synchronization signal that is a negative logical product of the clock signal and the clock delay inversion signal obtained by further inverting the clock delay signal obtained by delaying the clock signal by the dead time.

According to the configuration described above, the clock synchronization signal is the negative logical product of the clock signal and the clock delay inversion signal obtained by further inverting the clock delay signal obtained by delaying the clock signal by the dead time. In addition, the dead time is based on the clock synchronization signal. Therefore, for example, the dead time can be generated only when the clock synchronization signal is in the falling state.

The dead time generator (clock synchronization signal generators 40 and 40a) according to Aspect 4 of the disclosure, in Aspect 2, in which the dead time may be based on the clock synchronization signal that is the logical sum of the clock inversion signal obtained by inverting the clock signal and the clock delay signal by delaying the clock by the dead time.

According to the configuration described above, the clock synchronization signal is the logical sum of the clock inversion signal obtained by inverting the clock signal and the clock delay signal obtained by delaying the clock by the dead time. In addition, the dead time is based on the clock synchronization signal. Therefore, for example, the clock synchronization signal can be in the falling state only when the dead time generates.

The digital signal processing device (dead time generation circuit 1) according to Aspect 5 of the disclosure, in any one of Aspects 1 to 4, in which the dead time generator (clock synchronization signal generators 40 and 40a) and the switching circuit 52 may be provided.

The digital signal processing device (dead time generation circuit 1) according to Aspect 6 of the disclosure, in Aspect 3 or 4, in which the digital signal processing device provided with the dead time generator (clock synchronization signal generators 40 and 40a) may include the switching circuit 52, and the digital sampling circuit that synchronizes the digital signal input to the clock signal digital signal processing device, with the clock signal.

The digital signal processing device (dead time generation circuit 1) according to Aspect 7 of the disclosure, in Aspect 6, in which the drive circuit (gate drive circuit 51), which outputs the drive signal that is the logical product of the clock synchronization signal and the digital signal, to the switching circuit 52, may be further provided.

According to the configuration described above, the digital signal processing device includes the drive circuit outputting the drive signal, which is the logical product of the clock synchronization signal and the digital signal input to the digital signal processing device, to the switching circuit. Therefore, the drive signal can be output based on the digital signal input to the digital signal processing device. For example, the drive signal can be set to 0 V while the dead time generates. Therefore, since the plurality of pulses having different widths are controlled to the pulses having the constant width, the time width of the pulse is not unbalanced, and noise mixed in the drive signal can be reduced.

The digital signal processing device (dead time generation circuit 1) according to Aspect 8 of the disclosure, in any of Aspects 5 to 7, in which the switching circuit 52 may perform resonant switching.

According to the configuration described above, the switching circuit performs the resonant switching. Therefore, application to the class E amplifier is possible, and the output by the single pulse can be obtained.

The disclosure is not limited to the embodiments described above, and various modifications are possible within the scope illustrated in the claims, and embodiments obtained by appropriately combining technical means disclosed in different embodiments are also included in the technical scope of the disclosure. Furthermore, a new technical feature can be formed by combining the technical means disclosed in each embodiment.

The invention claimed is:

1. A digital signal processing device comprising:
   a first differential receiver that generates a first digital signal,
   a second differential receiver that generates a clock signal,
   a digital sampling circuit that samples the first digital signal supplied from the first differential receiver and converts the first digital signal into a second digital signal and a third digital signal,
   a dead time generator that generates a clock synchronization signal based on the clock signal supplied from the second differential receiver,
   a gate drive circuit that generates a first gate signal from the second digital signal supplied from the digital sampling circuit and the clock synchronization signal supplied from the dead time generator, and generates a second gate signal from the third digital signal supplied from the digital sampling circuit and the clock synchronization signal supplied from the dead time generator,
   a switching circuit that includes two switching elements, wherein the two switching elements respectively are supplied with the first gate signal and the second gate signal from the drive circuit, wherein
   the dead time generator generates a dead time in which gates of both of the two switching elements are in an off state,
   the clock synchronization signal alternately repeats the dead time of a first time width and a pulse of a second time width,
   the second digital signal includes at least one single pulse, each having a third time width, and at least one continuous pulse, each having a fourth time width that is twice the third time width,
   the third digital signal includes at least one single pulse, each having a fifth time width, and at least one continuous pulse, each having a sixth time width that is twice the fifth time width,
   the first gate signal is generated as a logical product of the clock synchronization signal and the second digital signal, and
   the second gate signal is generated as a logical product of the clock synchronization signal and the third digital signal.

2. The digital signal processing device according to claim 1,
   wherein the digital sampling circuit generates the second digital signal and the third digital signal by causing a start point of time of the first digital signal to coincide with a rising start point of time of the clock signal.

3. The digital signal processing device according to claim 1,
   wherein the dead time generator includes a delay circuit that generates a clock delay inversion signal and generates a negative logical product of the clock signal and the clock delay inversion signal.

4. The digital signal processing device according to claim 1,
wherein the dead time generator includes a delay circuit that generates a clock delay signal and generates a logical sum of a clock inversion signal obtained by inverting the clock signal and the clock delay signal.

5. The digital signal processing device according to claim 1,
wherein the switching circuit is a half bridge circuit,
the two switching elements are a first switching element and a second switching element, one of the first switching element and the second switching element is on the high side, and the other one is on the low side,
the gate drive circuit includes a first gate drive circuit connected to the first switching element and a second gate drive circuit connected to the second switching element,
the first gate drive circuit generates the gate signal which is a logical product of the clock synchronization signal and the second digital signal,
the second gate drive circuit generates the gate signal which is a logical product of the clock synchronization signal and a digital inversion signal obtained by inverting the third digital signal,
a first drain-source voltage supplied to the first switching element includes two types of pulses having a same time width as the single pulse of the second digital signal and the continuous pulse of the second digital signal,
a second drain-source voltage supplied to the second switching element includes two types of pulses that respectively have a same time width as the single pulse of the third digital signal and a same time width as the continuous pulse of the third digital signal.

6. The digital signal processing device according to claim 1,
wherein the switching circuit performs resonant switching.

* * * * *